United States Patent [19]
Tanner et al.

[11] Patent Number: 5,683,756
[45] Date of Patent: Nov. 4, 1997

[54] GOLD PLATING PROCESS FOR ZINC SUBSTRATES

[75] Inventors: James W. Tanner, Hamilton, Ohio; Todd Dennis, Batesville; Tim Chaffee, Brooksville, both of Ind.

[73] Assignee: Batesville Casket Company, Inc., Batesville, Ind.

[21] Appl. No.: 605,910

[22] Filed: Feb. 23, 1996

[51] Int. Cl.$^6$ .............................. B05D 1/04; C23C 14/02; C23C 16/14

[52] U.S. Cl. .................. 427/475; 427/250; 427/405; 427/534; 427/541

[58] Field of Search ................................ 427/475, 541, 427/532, 250, 402, 405, 409, 534

[56] References Cited

U.S. PATENT DOCUMENTS

| | | | |
|---|---|---|---|
| 3,186,864 | 6/1965 | Etal | 117/93.42 |
| 4,309,460 | 1/1982 | Singh et al. | 427/250 |
| 4,740,384 | 4/1988 | Meisner et al. | 427/14.1 |
| 5,468,518 | 11/1995 | Lein et al. | 427/421 |
| 5,540,788 | 7/1996 | Defalco et al. | 148/246 |

*Primary Examiner*—Shrive Beck
*Assistant Examiner*—Bret Chen
*Attorney, Agent, or Firm*—Wood, Herron & Evans, L.L.P.

[57] ABSTRACT

A method for plating zinc substrates with 24K gold. The method includes precleaning the substrate; applying a paint base coat electrostatically; curing the base coat; plating the gold by vacuum metallization; applying a clear paint top coat; and curing the top coat.

9 Claims, No Drawings

GOLD PLATING PROCESS FOR ZINC SUBSTRATES

FIELD OF INVENTION

The invention relates to a plating process and more particularly to a process for gold plating zinc substrates by vacuum metallization.

BACKGROUND OF THE INVENTION

Metal coating or plating of metal or plastic parts can be accomplished using one of a variety of known techniques, such as electroplating, low temperature arc vapor deposition, sputtering and vacuum metallizing. In the context of decorative parts and hardware used on caskets, the plating process is critical to achieve desired color consistency and adherence of the plated metal onto the part. In the case of plating gold onto metal parts, color consistency and adherence are particularly critical factors. Heretofore, electroplating generally was the process of choice; however, electroplating has certain drawbacks from an economic standpoint, as well as being less environmentally "friendly" as it requires the disposal of solutions which may contain hazardous or otherwise undesirable contaminants.

What is needed is a process for gold plating metal parts, including hardware and decorative parts for caskets, that is economical, environmentally friendly and provides consistent color coatings with good adhesion to the substrate metal.

SUMMARY OF THE INVENTION

In its broadest aspects, the present invention is directed to a method of plating a metal substrate with gold. The method of the invention, which is particularly applicable to plating 24K gold onto zinc substrates, includes applying a paint base coat to a precleaned surface of a zinc substrate and curing the paint base coat. Thereafter the gold is plated onto the paint base coat by vacuum metallization, and a protective paint top coat is applied over the gold plating and cured. The paint top coat is preferably clear/transparent.

The products resulting from the method of the present invention exhibit excellent adhesion of the gold plating to the substrate, which is due at least in part to the base coat, as well as consistent coloring of the gold plating. Another attendant advantage of the method of the present invention is the relative economic savings vis-a-vis known electroplating methods. Furthermore, the method of the invention avoids the environmental drawbacks of electroplating methods in general.

In a specific embodiment of the invention, a zinc substrate is precleaned by first washing the surfaces thereof to be plated with an iron phosphatizer. The surfaces are then rinsed with water and a rinsing agent is applied to enhance removal of grease and lubricants. Subsequently, the zinc substrate is dried and a paint base coat is applied to the precleaned surfaces by an electrostatic application process. The base coat is cured and baked onto the zinc substrate. Thereafter the gold is plated onto the paint base coat by vacuum metallization. As a means of protecting the gold plating and further ensuring its adherence to the substrate, a clear paint top coat is applied over the gold plating by an electrostatic application process. Thereafter the top coat is cured and the part is complete.

These and other features and aspects of the present invention will become more apparent to persons skilled in the art upon reading the detailed description of the invention.

DETAILED DESCRIPTION OF THE INVENTION

The method of the present invention has particular applicability and provides advantages in the context of gold plating zinc parts to be used as hardware or decorative items on caskets. Among the advantages are consistent color coatings, which is essential for casket hardware, and excellent adherence of the gold plating to the substrate part.

The details of the present invention are exemplified by the following description of a preferred embodiment thereof. In a first step, a zinc substrate part is subjected to a three-stage washing or precleaning operation. The first stage is spray washing the part, and particularly the surfaces thereof to be plated, with an iron phosphatizer. A suitable product for this purpose is Secure Spray Iron Phosphatizer, available from Diversey Corp., a division of DuBois Chemical. The phosphatizer may be mixed with an additive such as DK Solvent Cleaning Additive available from Diversey Corp. Thereafter, the pan is rinsed with clear water and a heavy duty rinse additive such as DU-DRI, available from DuBois Chemical, is applied to the part to aid in cleaning greases and lubricants from the zinc substrate which tend to remain on the surfaces after the parts are formed. Subsequent to the three stage precleaning step, the pan is oven dried for about 8–10 minutes at a temperature of about 300°–310° F.

As an aid in the adherence of the gold to the substrate, a solvent-based paint base coat is applied to the substrate via an electrostatic disc application process. A preferred base coat paint is No. 3001B available from Color Coatings Corp. of Lombard, Ill. The base coat is applied via electrostatic disc application, which is a well known method for applying paints. It has been found that applying the base coat wherein the electrostatic disc is rotating at a rate of 5500–8000 rpm, the part is rotated in the range of 40–45 hertz, and wherein the paint pressure is about 8–12 psi, results in an excellent paint coating. The paint base coat is then cured in an oven at about 265°–275° F. for about 40–42 minutes.

Subsequent to curing of the paint base coat, the gold plating is performed. The gold plating operation is accomplished utilizing vacuum metallization. In this regard, it has been found particularly suitable for plating 24K gold to place a 24K gold wire having a diameter 0.08 " in a vacuum metallizing chamber held in place with tungsten filaments such as BA9-125 filaments available from Midwest Tungsten. The part to be coated is typically held in the chamber under vacuum on the order of $3.5 \times 10^{-4}$ torr for approximately 20–30 minutes. The final thickness of the gold plating is targeted to be in the range of 4,000–5,000 angstroms.

Once the plating step is complete, a clear paint top coat is applied over the gold plating. The top coat is preferably solvent-based paint No. 3117-3 available from Color Coatings Corp. The top coat is applied via electrostatic disc application wherein the disc is rotated at 5500–8000 rpm, the part is rotated at 40–45 hertz, and the paint is applied at a pressure of about 10½–15 psi. Lastly, the top coat is cured in an infrared oven at a temperature of about 110°–130° F. for 5–7 minutes. The resulting gold plated parts exhibit excellent color consistency and adhesion.

While the method of the present invention has been described in detail herein with respect to specific embodiments and parameters, the invention is not intended to be limited to specific details disclosed, but rather is defined by and commensurate in scope with the appended claims.

What is claimed is:

1. A method of plating a zinc substrate with gold, comprising the steps of:

applying a paint base coat to at least one precleaned surface of a zinc substrate;

curing said paint base coat;

plating gold onto said paint base coat by vacuum metallization to form a gold plating;

applying a paint topcoat over said gold plating; and curing said paint topcoat.

2. The method of claim 1 wherein said paint base coat is applied electrostatically.

3. The method of claim 1 wherein said paint base coat is cured at a temperature in the range of about 265°–275°F. for a duration of about 40–42 min.

4. The method of claim 1 wherein said paint topcoat is applied electrostatically.

5. The method of claim 1 wherein said paint topcoat is cured at a temperature in the range of about 110°–130°F. for a duration of about 5–7 min.

6. The method of claim 1 further comprising a precleaning sequence prior to said paint base coat application step, comprising:

washing said at least one surface of said zinc substrate with an iron phosphatizer;

rinsing said at least one surface with water; and applying a rinsing agent to said at least one surface to enhance removal of grease and lubricants therefrom.

7. The method of claim 6 further comprising:

drying said zinc substrate subsequent to said precleaning sequence at a temperature in the range of about 300°–310°F. for about 8–10 min.

8. The method of claim 1 wherein said gold is 24K gold.

9. A method of plating a zinc substrate with 24K gold, comprising the steps of:

precleaning at least one surface of a zinc substrate by the steps of:

washing said at least one surface of said zinc substrate with an iron phosphatizer;

rinsing said at least one surface with water; and applying a rinsing agent to said at least one surface to enhance removal of grease and lubricants therefrom;

applying a paint base coat to said precleaned surface of said zinc substrate;

curing said paint base coat;

plating 24K gold onto said paint base coat by vacuum metallization to form a gold plating;

applying a paint topcoat over said gold plating; and curing said paint topcoat.

* * * * *